(12) United States Patent
Hu et al.

(10) Patent No.: US 8,228,669 B2
(45) Date of Patent: Jul. 24, 2012

(54) LAYOUT STRUCTURE OF SERVER CHASSIS

(75) Inventors: Yong-Liang Hu, Shanghai (CN); Yang Zhang, Shanghai (CN); Ji-Peng Xu, Shanghai (CN); Tsai-Kuei Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 302 days.

(21) Appl. No.: 12/635,022

(22) Filed: Dec. 10, 2009

(65) Prior Publication Data

US 2011/0096484 A1 Apr. 28, 2011

(30) Foreign Application Priority Data

Oct. 28, 2009 (CN) .......................... 2009 1 0209163

(51) Int. Cl.
  *H05K 7/14* (2006.01)
(52) U.S. Cl. ..................... 361/679.2; 361/788; 361/796; 211/41.12
(58) Field of Classification Search .................. 361/788, 361/796, 679.01, 679.02; 211/41.12, 41.17; 710/300, 301
See application file for complete search history.

(56) References Cited

U.S. PATENT DOCUMENTS

| | | | | |
|---|---|---|---|---|
| 6,538,903 | B1 * | 3/2003 | Radu et al. | 361/818 |
| 6,542,384 | B1 * | 4/2003 | Radu et al. | 361/818 |
| 6,833,996 | B2 * | 12/2004 | Haworth | 361/730 |
| 7,042,737 | B1 * | 5/2006 | Woolsey et al. | 361/799 |
| 7,295,442 | B2 * | 11/2007 | Garnett et al. | 361/728 |
| 8,009,438 | B2 * | 8/2011 | Leigh et al. | 361/788 |
| 2002/0131247 | A1 * | 9/2002 | Cooray | 361/750 |
| 2007/0247825 | A1 * | 10/2007 | Bynum et al. | 361/788 |

* cited by examiner

*Primary Examiner* — Dameon Levi
(74) *Attorney, Agent, or Firm* — J.C. Patents (57) ABSTRACT

A server chassis layout structure includes a chassis body, a partition plate, and a power backplane module. The chassis body includes a bottom plate, first and second top plates, and two side plates. The first and second top plates form a first opening therebetween. The side plates are mounted between the bottom and top plates. The partition plate includes at least one retaining portion and is perpendicularly fixed to the bottom plate below the first opening. The partition plate divides the chassis body into first and second sections. The power backplane module includes at least one lock portion and is vertically inserted into the chassis body via the first opening. The lock portion interferes with the retaining portion so as to assemble the power backplane module into the chassis body above the partition plate, and both the power backplane and the partition plate are exposed via the first opening.

16 Claims, 8 Drawing Sheets

LAYOUT STRUCTURE OF SERVER CHASSIS

CROSS-REFERENCE TO RELATED APPLICATION

This application claims the priority benefit of China application serial no. 200910209163.X, filed Oct. 28, 2009. The entirety of the above-mentioned patent application is hereby incorporated by reference herein and made a part of specification.

BACKGROUND OF THE INVENTION

1. Field of the Invention

The present invention relates to a layout structure of a server chassis, and more particularly, to a new architecture of a layout structure of a server chassis.

2. Description of Related Art

As a core computer serving various computers within a network system, the server provides the storage and print function for network users as well as enables the network users to share various network resources. The basic architecture of the server is generally the same as a personal computer, which consists of a central processing unit (CPU), a memory, I/O devices, or the like. Buses are used to interconnect these internal components. A north bridge chip connects the CPU and the memory, and a south bridge chip is connected to the I/O devices.

Taking a rackmount server as an example, a rackmount server is a server with a standard outer shape to be used with a server cabinet. The width of the rackmount server is 19 inches and the unit of measure for height of the server is U, where 1U=1.75 inches=44.45 millimeters. The typical standard height specifications for servers include 1U, 2U, 3U, 4U, 5U and 7U.

After the server is installed, all its I/O cables lead out of the server cabinet from a rear thereof (all interfaces of the rackmount server are also disposed on the rear of the server cabinet) and are arranged within a cable trunk of the server cabinet, usually labeled for ease of management. However, the chassis of the rackmount server has typically already been filled with electronic components and heat dissipating devices. Therefore, this type of server is often limited by its expandability and heat dissipating problem. Screen work must be done to screen out usable components and full expansion of the server generally cannot be achieved. Therefore, one single server has only a limited performance and a limited application scope. The single server can only focus its use on one aspect, for example, the use of providing remote storage and internet services.

Therefore, an expansion card must be added if increasing the single server performance is desired. However, not all added expansion cards can receive power from the server. A frequently encountered problem is that it is necessary to additionally provide a power supply for the expansion card. To this end, in assembly, an independent power supply needs to be provided on the motherboard in addition to the assembly of the expansion card. As a result, under the condition that reconfiguration of the circuitry and components on the motherboard is impossible, users often have to give up the expansion card or otherwise arrange an independent power supply outside the server cabinet. However, arranging an independent power supply outside the server cabinet would destroy the space-saving advantage of the rackmount server because the independent power supply needs additional space.

SUMMARY OF THE INVENTION

Accordingly, the present invention is directed to a new architecture layout structure for a server chassis that has improved commonality and reduced fabrication cost.

One embodiment of the present invention provides a server chassis layout structure which includes a chassis body, a partition plate, and a power backplane module. The chassis body includes a bottom plate, a first top plate, a second top plate, and a pair of side plates. The first and second top plates are positioned opposite to the bottom plate. A first opening is defined between the first top plate and the second top plate. The side plates are perpendicularly mounted between the bottom plate and the top plates, and are positioned at opposite sides of the first opening. The partition plate includes at least one retaining portion and is perpendicularly fixed to the bottom plate below the first opening. The partition plate divides the chassis body into a first section and a second section different from each other. The first top plate and the second top plate are disposed in the first section and the second section, respectively. The power backplane module includes at least one lock portion and is vertically inserted into the chassis body via the first opening. The lock portion interferes with the retaining portion so as to assemble the power backplane module into the chassis body above the partition plate, and both the power backplane module and the partition plate are exposed via the first opening. The power backplane module leans against one side of the second top plate at the first opening.

According to one embodiment of the present invention, the power backplane module includes a power backplane and a support member. The power backplane has the lock portion disposed thereon. The support member is closely contact with the power backplane and leans against the pair of side plates to reinforce the structure of the power backplane.

According to one embodiment of the present invention, the lock portion of the power backplane is a pair of recesses, the retaining portion of the partition plate is a pair of bent arms, and the bent arms are engaged into the recesses.

According to one embodiment of the present invention, the power backplane comprises a plurality of first aligning portions formed at a lower edge thereof, the partition plate comprises a plurality of second aligning portions formed at an upper edge thereof, the first aligning portions and the second aligning portions are engaged with each other respectively.

According to one embodiment of the present invention, the server chassis layout structure further includes a plurality of fasteners. The support member includes a pair of support portions. The support portions are disposed on opposite two ends of the support member and lean against the pair of side plates. The support portions are fastened to the pair of side plates with the fasteners.

According to one embodiment of the present invention, the second top plate includes a bent portion extending from the first opening into an interior of the chassis body.

According to one embodiment of the present invention, the chassis body further includes at least one guide member disposed on the bent portion. The support member includes at least one positioning portion. The power backplane module is assembled to the partition plate with the positioning portion moving along the guide member to engage with the guide member.

According to one embodiment of the present invention, the support member has a first support surface facing the first opening and leaning against the first top plate, and the first top plate has a second support surface adjacent the first opening. The chassis body further comprises a cover, and the cover moves along the first support surface and the second surface and connects the first top plate and the second top plate to close the first opening.

According to one embodiment of the present invention, the power backplane includes a board, a first connector, and a second connector. The board is inverted U-shaped and has opposite first and second faces. The first connector is disposed on the first face of the board. The second connector is disposed on the second face of the board.

According to one embodiment of the present invention, the server chassis layout structure further has a second opening and a third opening, at least one power supply, and at least one motherboard module. The second opening and third opening are disposed at the first section and the second section, respectively. The power supply slides into the first section of the chassis body via the second opening so as to be connected to the first connector. The motherboard module slides into the second section of the chassis body via the third opening so as to be connected to the second connector. The power supply and the motherboard module are withdrawable from the chassis body via the second opening and the third opening in opposite directions, respectively.

According to one embodiment of the present invention, the motherboard module slides, in a vertical orientation, into the second section and comprises a third connector. The third connector is electrically connected with the second connector.

According to one embodiment of the present invention, the power supply is disposed at a top portion of the first section.

According to one embodiment of the present invention, the server chassis layout structure further includes at least one I/O module and a board-to-board connector. The I/O module slides into the first section of the chassis body via the second opening. The board-to-board connector is disposed on the motherboard module. The partition plate has at least one fourth opening communicating between the first section and the second section. The I/O module disposed at the first section is electrically connected with the motherboard module at the second section by the board-to-board connector passing through the fourth opening.

According to one embodiment of the present invention, the power backplane further includes a fourth connector disposed on the first face of a pair of legs of opposite ends of it.

According to one embodiment of the present invention, the server chassis layout structure further includes a management module sliding into the first section of the chassis body via the second opening so as to be connected to the fourth connector.

According to one embodiment of the present invention, the management module slides, in a vertical orientation, into the first section and is positioned at opposite two sides of the first section adjacent the pair of side plates.

In view of the foregoing, in the server chassis layout structure of embodiments of the present invention, with the interengagement between the coupling portion of the partition plate and the coupling portions of the power backplane and the support member, the power supply module can be removably assembled to the partition plate of the chassis body. This enables the chassis body to share the electronic components that are used with chassis bodies of other specifications, thus improving the commonality as sell as reducing the fabrication cost of the chassis body of the server of the present invention.

In order to make the aforementioned and other features and advantages of the present invention more comprehensible, embodiments accompanied with figures are described in detail below.

DESCRIPTION OF THE EMBODIMENTS

Figure 1:
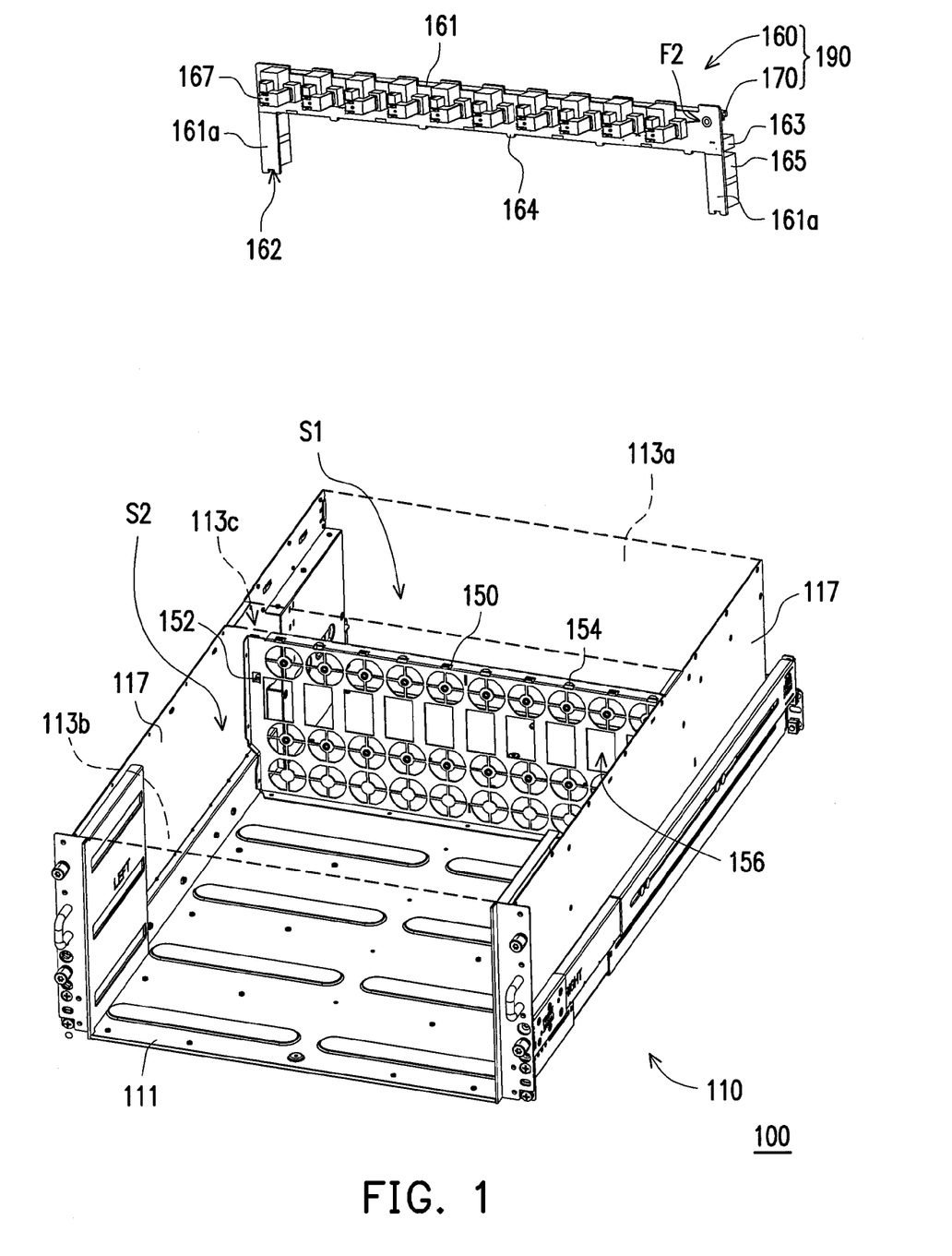
FIG. 1 illustrates a layout structure of a server chassis according to one embodiment of the present invention.

FIG. 1 illustrates a layout structure of a server chassis according to one embodiment of the present invention. Referring to FIG. 1, while a 5U server is taken as an example in the present embodiment, the principle of the present invention could be equally applied to a server of another specification. The server chassis layout structure 100 includes a chassis body 110, a partition plate 150, and a power backplane module 190. The chassis body 110 includes a bottom plate 111, a first top plate 113a, a second top plate 113b, and a pair of side plates 117. Both the first top plate 113a and the second top plate 113b are positioned opposite to the bottom plate 111, and a first opening 113c is formed between the first top plate 113a and the second top plate 113b. The side plates 117 are perpendicularly mounted between the bottom plate 111 and the top plates 113a, 113b. The side plates 117 are disposed at opposite sides of the first opening 113c. The partition plate 150 includes at least one retaining portion 152. The partition plate 150 is perpendicularly mounted on the bottom plate 111 below the first opening 113c. The partition plate 150 divides the chassis body 110 into a first section S1 and a different second section S2, with the first top plate 113a and the second top plate 113b positioned at the first section S1 and the second section S2, respectively. The power backplane module 190 includes at least one lock portion 162 and is vertically inserted into the chassis body 110 via the first opening 113c. With the interference between the lock portion 162 and the retaining portion 152, the power backplane module 190 can be assembled to the chassis body 110 above the partition plate 150, with the power backplane module 190 and the partition plate 150 exposed via the first opening 113c. The power backplane module 190 leans against one side of the second top plate 113b at the first opening 113c.

As described above, the present invention employs the partition plate 150 to divide the chassis body 110 into two sections S1, S2, and the power backplane module 190 is assembled to the partition plate 150 via the first opening 113c and is oriented the same as the partition plate 150. This provides a new idea of the architecture of the server, which not only permits electronic components used with chassis bodies of other size and with different satisfaction to be used with the chassis body 110 of the present invention, but also permits electronic components installed in the chassis body 110 to be individually repaired. As such, the present invention can enhance the commonality and reduce the fabrication cost of the server 100 thus meeting the demands for custom-made products.

Figure 2:
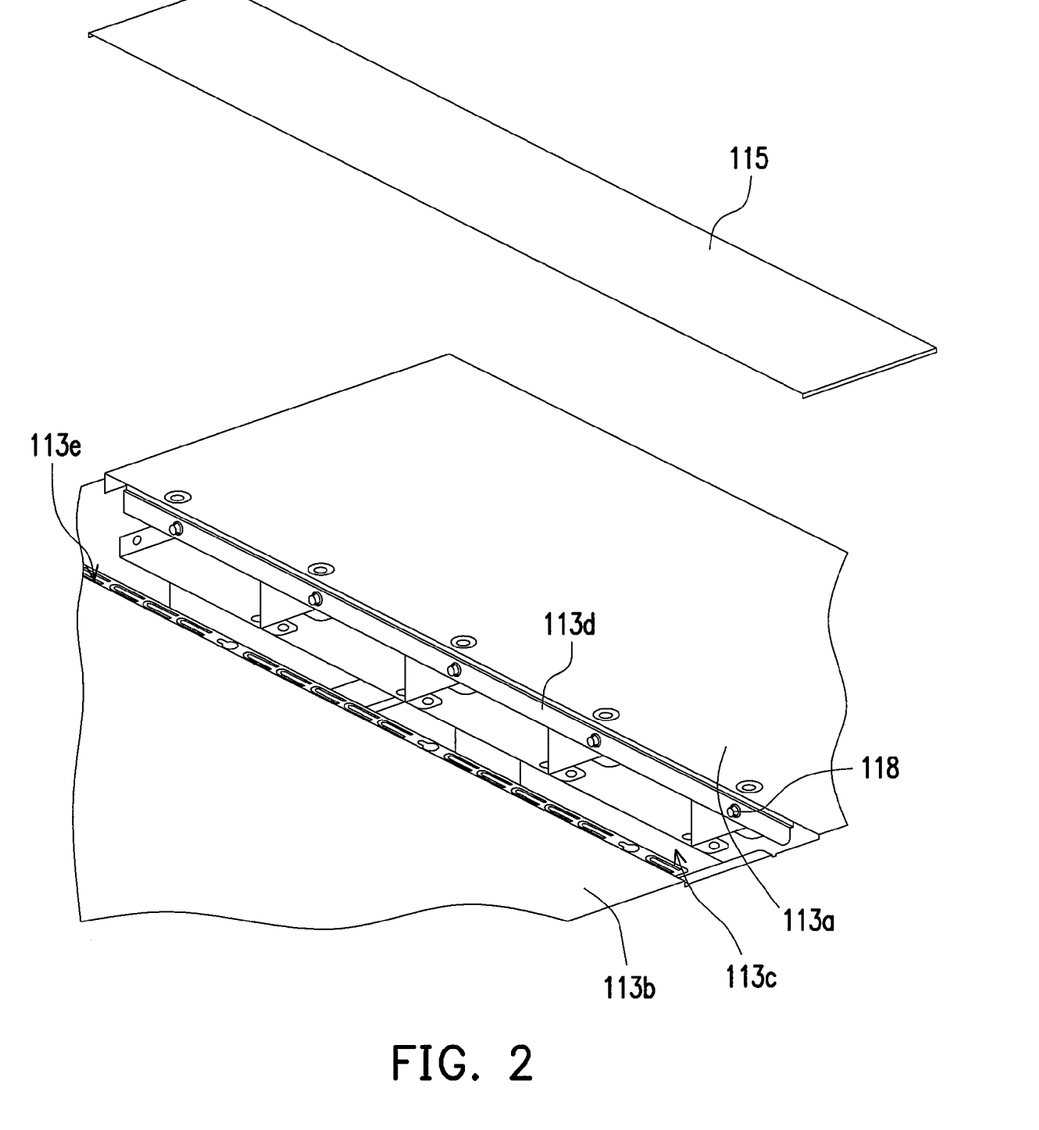
FIG. 2 is a partial enlarged view of the chassis body of FIG. 1.

More detailed description is made below with reference to FIG. 2 which is a partial enlarged view of the chassis body of FIG. 1. Referring to FIGS. 1 and 2, the power backplane module 190 includes a power backplane 160 and a support member 170. The power backplane 160 has the lock portion 162, and the support member 170 is closely contact with the power backplane 160 to thereby reinforce the structure of the power backplane 160. When the power backplane module 190 is assembled into the chassis body 110, the support member 170 leans against the side plates 117 to help mount the power backplane 160 in the chassis body 110. The power backplane 160 has a plurality of first aligning portions 164 on a lower edge thereof and the partition plate 150 has a plurality of second aligning portions 154 on an upper edge thereof. After the first and second aligning portions 164 and 154 are aligned and mounted with each other and the lock portion 162 and the retaining portion 152 are interlocked with each other, the power backplane module 190 can be supported on the partition plate 150.

In the present embodiment, the lock portion 162 of the power backplane 160 is a pair of recesses, the retaining portion 152 of the partition plate 150 is a pair of bent arms, and the bent arms are engaged into the recesses such that the power backplane 160 is mounted on the partition plate 150. However, it is not intended to limit the lock portion 162 and the retaining portion 152 to any particular form as described herein. Rather, any structure that enables the power backplane 160 to be mounted on the partition plate 150 can be used with the present invention.

After assembly, both the power backplane module 190 and the partition plate 150 are exposed via the first opening 113c, and the power backplane module 190 leans against one side of the second top plate 113b at the first opening 113c. In other words, the partition plate 150 and the bottom plate 111 are assembled together with one perpendicular to the other. Therefore, the power backplane module 190 is assembled onto the partition plate 150 via the first opening 113c in a direction parallel to the partition plate 150.

Figure 3:
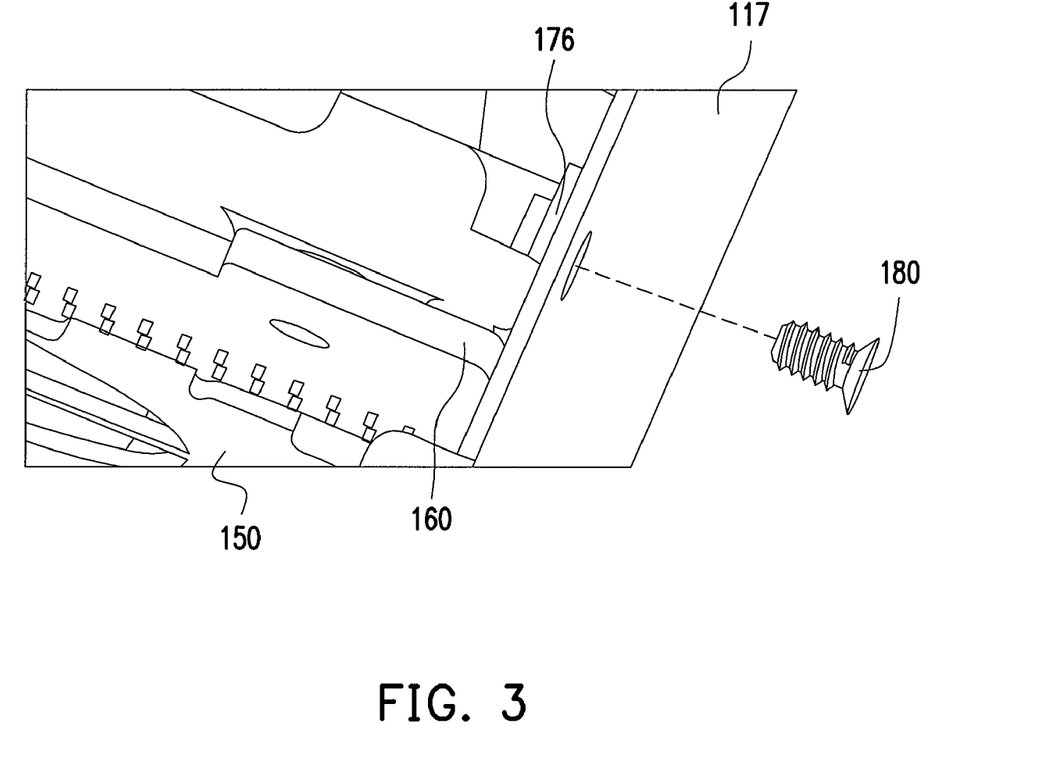
FIG. 3 is an assembled view of a part of the chassis body of FIG. 2.

FIG. 3 is an assembled view of a part of the chassis body of FIG. 2. In the present embodiment, the server chassis layout structure 100 further includes a plurality of fasteners 180 (e.g. screws), and the support member 170 includes a pair of support portions 176 on two ends thereof. Once the power backplane module 190 is assembled onto the partition plate 150, the support portions 176 lean against the side plates 117. At this time, the power backplane module 190 can be fastened to the side plates 117 with fasteners 180.

Figure 4:
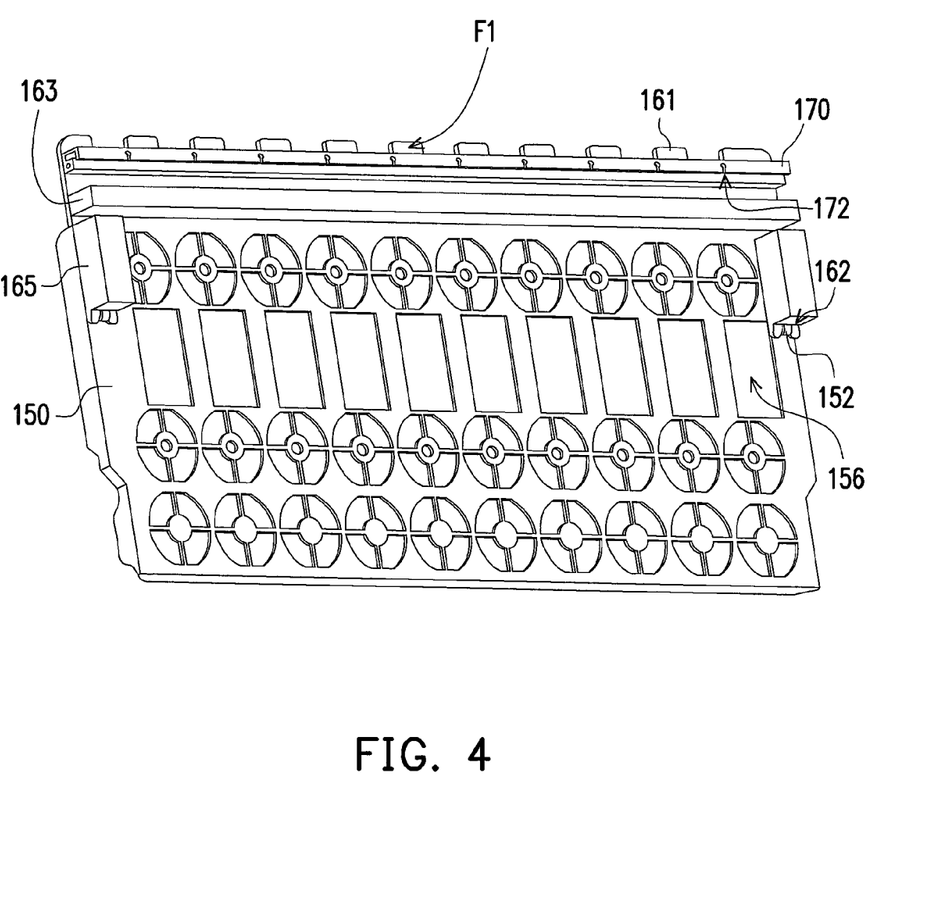
FIG. 4 illustrates the power backplane module of FIG. 1, viewed from another angle.

FIG. 4 illustrates the power backplane module and the partition plate of FIG. 1, viewed from another angle. Referring to FIGS. 2 and 4, the second top plate 113a has a bent portion 113d extending from the first opening 113c into an interior of the chassis body 110. The chassis body 110 further includes a plurality guide members 118 positioned at one side of the first opening 113c and substantially disposed on the bent portion 113d. The support member 170 includes a plurality of positioning portions 172 positioned in correspondence with the guide members 118. As such, by moving the positioning portions 172 along the guide members 118 to engage with the guide members 118, the power backplane module 190 can be vertically inserted into the chassis body 110 through the first opening 113c.

For example, the guide members 118 are, for example, standoffs, and the positioning portions 172 are, for example, gourd-shaped slots into which the standoffs can be engaged.

Therefore, the power backplane module 190 can be assembled onto the partition plate 150 by the guide members 118 sliding into corresponding positioning portions 172. It is not intended to limit the positioning and engagement structures between the power backplane module 190 and the partition plate 150 to any particular structures described herein. Rather, the positioning and engagement structures can be modified depending on actual requirements and any structure that enables the power backplane module 190 to be successfully assembled to the partition plate 150 through the first opening 113c can be used with the present invention.

Figure 5:
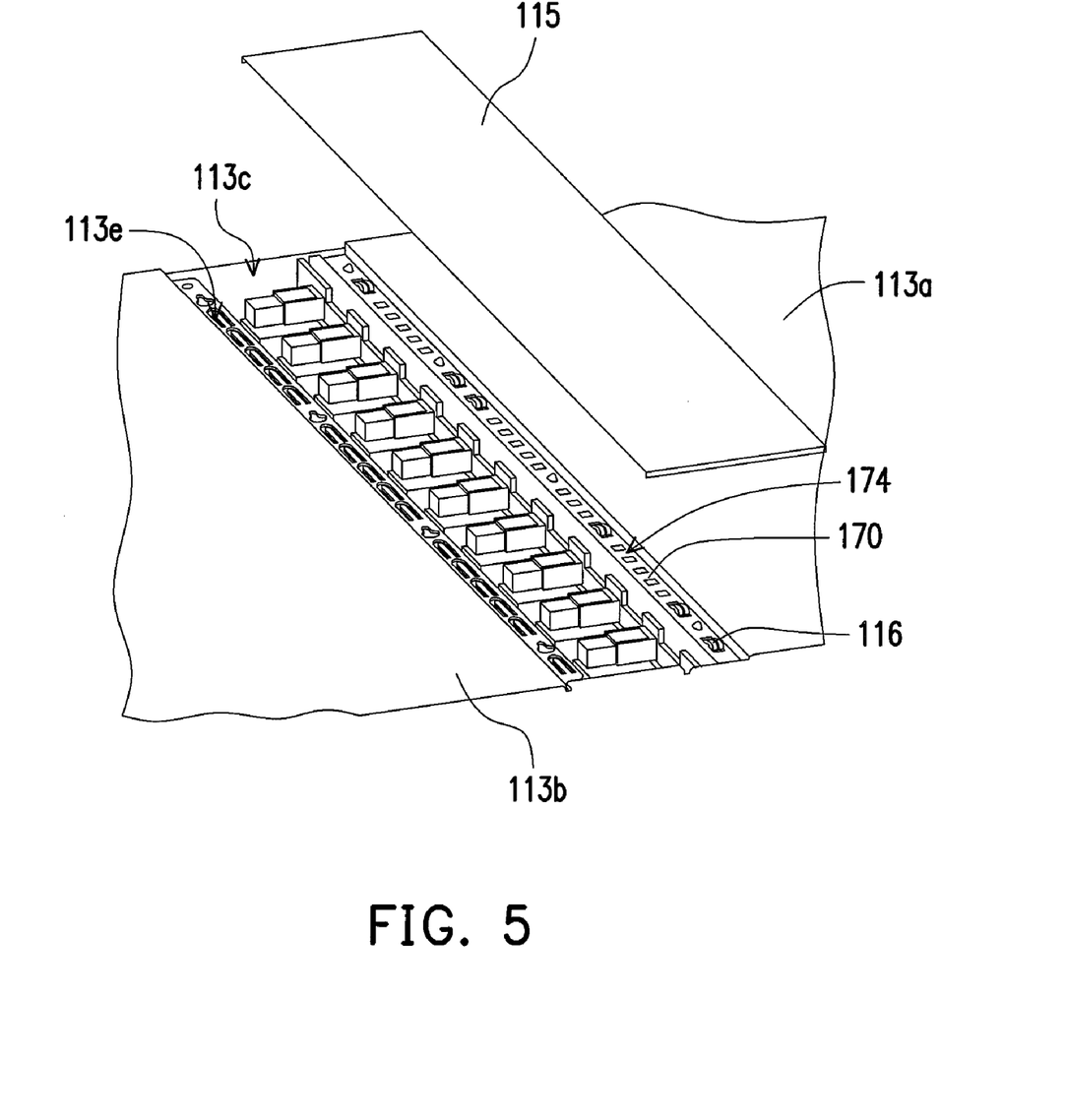
FIG. 5 is an assembled view of the server chassis layout structure of FIG. 1 with the power backplane being assembled.

FIG. 5 is an assembled view of the server chassis layout structure of FIG. 1 with the power backplane being assembled. Referring to FIGS. 1 and 5, in the present embodiment, the chassis body 110 further includes a cover 115 to be assembled between the first top plate 113a and the second top plate 113b to close the first opening 113c. In order for the cover 150 to be supported by the first and second top plates 113a and 113b after assembled, the support member 170 has a first support surface 174 facing the first opening 113c and leaning against the first top plate 113a, and the second top plate 113b has a second support surface 113e adjacent the first opening 113c. As such, the cover 115 can be assembled to the first and second top plates 113a and 113b along the first support surface 174 and the second support surface 113e, which overcomes the problem that the bent portion 113d at one side of the opening 113c is unable to support the cover 115.

Furthermore, the chassis body 110 further includes a plurality of elastic elements 116 disposed on the first support surface 174 of the support member 170. When the cover 115 is assembled to the first and second top plates 113a and 113b to close the first opening 113c, the elastic elements 116 contact the cover 115. This can channel any static current out of the chassis body 110 thus avoiding element damage caused by the static electricity interference.

Figure 6:
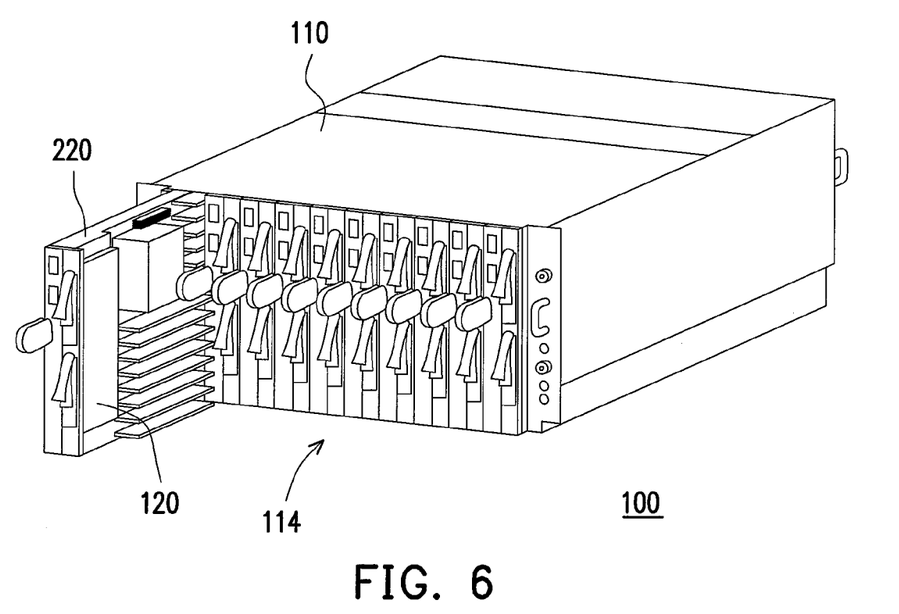
FIGS. 6 and 7 illustrate a server employing the server chassis layout structure of FIG. 1.
Figure 7:
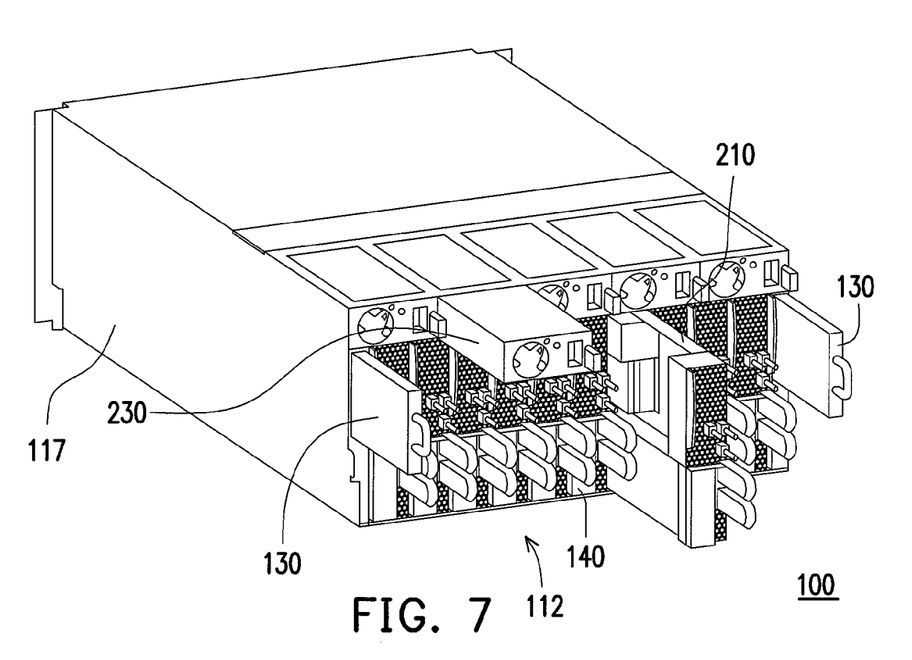

FIGS. 6 and 7 illustrate a server employing the server chassis layout structure of FIG. 1. Referring to FIGS. 1, 6 and 7, in the present embodiment, the server chassis layout structure 100 further includes a plurality of first trays 210 and a plurality of second trays 220. The first trays 210 are slidably disposed between the bottom plate 111 and the first top plate 113a, and are disposed in the first section S1.

In addition, the server chassis layout structure 100 further includes a plurality of motherboard modules 120, a plurality of management modules 130, and a plurality of I/O modules 140 that are disposed within the chassis body 110. The management modules 130 and the I/O modules 140 are disposed on the first trays 210. The second trays 220 are slidably disposed between the bottom plate 111 and the second top plate 113b, and are disposed in the second section S2. The motherboard modules 130 are disposed on the second trays 220.

It is noted that the chassis body 110 further has a second opening 112 and a third opening 114 positioned at the first section S1 and the second section S2, respectively. As such, the first trays 210 and the second trays 220 can be withdrawn from the chassis body 110 via the second opening 112 and the third opening 114 in opposite directions, respectively. In other words, due to the trays 210 and 220 withdrawable along different oppositions, it is made possible to replace components of or repair the motherboard modules 120, the management modules 130 and the I/O modules 140 disposed within the chassis body 110 individually, without first disassembling the entire chassis body 110. As such, the internal space of the chassis body 110 of the server 100 can be better utilized and the demands for custom-made products can be met.

The present embodiment sets no limits as to the number of the motherboard modules 120, the management modules 130 and the I/O modules 140 disposed within the chassis body 110. The number of these modules 120, 130 and 140 can be modified depending on actual requirements of the server 100 during use.

In the present embodiment, all the motherboard modules 120, the management modules 130 and the I/O modules 140 disposed within the chassis body 110 can be used with 1U server chassis body (not shown) or servers of other specification. In other words, the modules that were conventionally used with the 1U server system can be directly assembled into the 5U server system of the present embodiment for use. This indicates that the chassis body 110 of the present embodiment is highly compatible with the modules that were conventionally used with chassis bodies of other specifications, thus effectively enhancing the integration as well as reducing the fabrication cost of the server 100.

Figure 8:
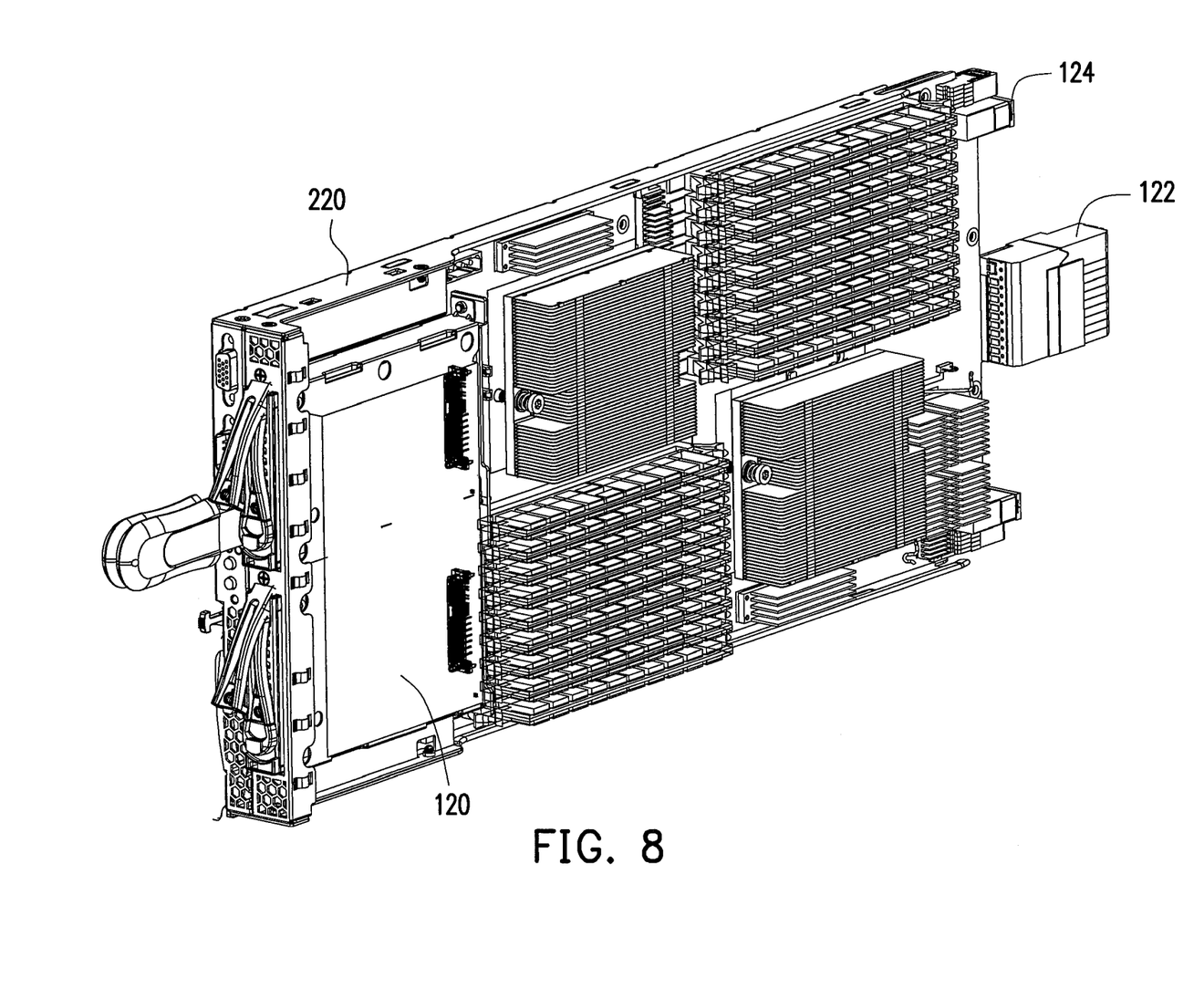
FIG. 8 illustrates one of the motherboard modules of FIG. 6.
Figure 9:
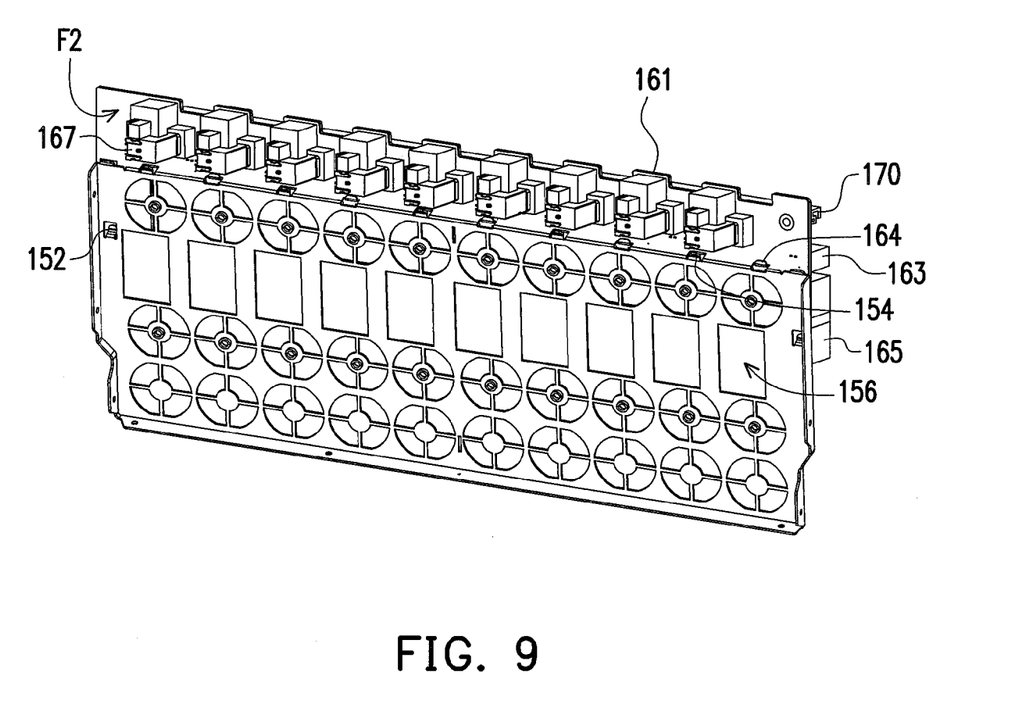
FIG. 9 is an assembled view showing the power backplane module assembled to the partition plate of FIG. 1.

FIG. 8 illustrates one of the motherboard modules of FIG. 6. FIG. 9 is an assembled view showing the power backplane module assembled to the partition plate of FIG. 1. Referring to FIGS. 1, 5~9, in the present embodiment, the power backplane 160 includes a circuit board 161, a plurality of first connecters 163, a plurality of second connectors 167, and a plurality of fourth connectors 165. The circuit board 161 is substantially inverted U-shaped having a first face F1 (as indicated on FIG. 4), a second face F2, and a pair of legs 161a positioned at opposites ends thereof. The above-mentioned lock portions 162 are disposed on the legs 161a.

Each fourth connector 165 is disposed on one of the legs 161a and on the first surface F1. The management module 130 slides into the first section S1 via the second opening 112 so as to be connected to a corresponding one of the fourth connectors 165. Each second connector 167 is disposed on the second face F2. The motherboard module 120 has a third connector 124. The motherboard module 120 slides into the second section S2 via the third opening 114 such that the third connector 124 is electrically connected to a corresponding one of the second connectors 167. In addition, the server 100 further includes a plurality of power supplies 230 that slide into the first section S1 of the chassis body 110 via the second opening 112 and are connected to the first connectors 163.

On the other hand, the partition plate 150 has a plurality of fourth openings 156 communicating between the first second S1 and the second section S2. The server 100 further includes a board-to-board connector 122 disposed on the motherboard module 120. As such, the I/O module 140 disposed in the first section S1 can be electrically connected with a corresponding one of the motherboard modules 120 disposed in the second section S2 via the board-to-board connector 122 passing through the fourth opening 156.

In addition, it is noted that, in the present embodiment, the power supplies 230 are disposed at a top portion of the first section S1. The management modules 130 slide, in a vertical orientation, into the first section S1 and are positioned at opposite sides of the first section S1 adjacent the side plates 117. The I/O modules 140 slide, in a vertical orientation, into the first section S1 and are positioned below the power supplies 230. Furthermore, the motherboard modules 120 slide, in a vertical orientation, into the second section S2 and are electrically connected with the power supplies 230, the management modules 130, and the I/O modules 140, correspondingly. However, the present embodiment sets no limits as to the locations of the modules within the chassis body 110. Any arrangement is possible as long as the modules are permitted to slide into the chassis body 110 from two opposite ends of the chassis body 110 and be electrically interconnected with one another.

In summary, in the server chassis layout structure of embodiments of the present invention, with the interengagement between the coupling portion of the partition plate and the coupling portions of the power backplane and the support member, the power backplane can be inserted into the accommodating space of the chassis body from above the chassis body via the opening of the top plate. This effectively simplifies the process of assembling the power backplane into the chassis body. Further, it is made possible to dispose the motherboard modules, the management modules and the I/O modules on opposite sides of the partition plate. Therefore, the internal space of the chassis body can be better utilized, and the present chassis body can share the modules that are used with chassis bodies of other specifications, thus greatly enhancing the integration and commonality as well as reducing the fabrication cost of the server.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A layout structure for a server chassis, comprising:
  a chassis body comprising:
    a bottom plate;
    a first top plate positioned opposite to the bottom plate;
    a second top plate positioned opposite to the bottom plate, the first top plate and the second top plate defining a first opening therebetween;
    a cover; and
    a pair of side plates perpendicularly mounted between the bottom plate and the top plates, the pair of side plates positioned at opposite sides of the first opening;
  a partition plate comprising at least one retaining portion, wherein the partition plate is perpendicularly fixed to the bottom plate below the first opening, the partition plate divides the chassis body into a first section and a second section different from each other, and the first top plate and the second top plate are disposed in the first section and the second section, respectively; and
  a power backboard module comprising at least one lock portion, wherein the power backboard module is vertically inserted into the chassis body only via the first opening when the first plate and the second plate are fixed, the lock portion interferes with the retaining portion so as to assemble the power backboard module to the top of the partition plate and both the power backboard and the partition plate are exposed via the first opening, the power backboard module leans against one side of the second top plate at the first opening, and the cover is assembled between the first top plate and the second top plate to seal the first opening and the power backplane module therein.

2. The layout structure for the server chassis according to claim 1, wherein the power backboard module comprises:
  a power backboard with the lock portion disposed thereon; and
  a support member being closely contact with the power backboard and leans against the pair of side plates to reinforce the structure of the power backboard.

3. The layout structure for the server chassis according to claim 2, wherein the lock portion of the power backboard is a pair of recesses, the retaining portion of the partition plate is a pair of bent arms, and the bent arms are engaged into the recesses.

4. The layout structure for the server chassis according to claim 2, wherein the power backboard comprises a plurality of first aligning portions formed at a lower edge thereof, the partition plate comprises a plurality of second aligning portions formed at an upper edge thereof, the first aligning portions and the second aligning portions are engaged with each other respectively.

5. The layout structure for the server chassis according to claim 2, further comprising a plurality of fasteners, wherein the support member comprises a pair of support portions, the support portions are disposed on opposite two ends of the support member and lean against the pair of side plates, and the support portions are fastened to the pair of side plates with the fasteners.

6. The layout structure for the server chassis according to claim 2, wherein the second top plate comprises a bent portion extending from the first opening into an interior of the chassis body.

7. The layout structure for the server chassis according to claim 6, wherein the chassis body further comprises at least one guide member disposed on the bent portion, the support member comprises at least one positioning portion, and the power backboard module is assembled to the partition plate with the positioning portion moving along the guide member to engage with the guide member.

8. The layout structure for the server chassis according to claim 2, wherein the support member has a first support surface facing the first opening and leaning against the second top plate, the first top plate has a second support surface adjacent the first opening, and the cover moves along the first support surface and the second surface and connects the first top plate and the second top plate to close the first opening.

9. The layout structure for the server chassis according to claim 2, wherein the power backboard comprises:
   a board being inverted U-shaped and having opposite first and second faces;
   a first connector disposed on the first face of the board; and
   a second connector disposed on the second face of the board.

10. The layout structure for the server chassis according to claim 9, further comprising:
    a second opening and a third opening disposed at the first section and the second section, respectively;
    at least one power supply sliding into the first section of the chassis body via the second opening so as to be connected to the first connector; and
    at least one motherboard module sliding into the second section of the chassis body via the third opening so as to be connected to the second connector, the power supply and the motherboard module being withdrawable from the chassis body via the second opening and the third opening in opposite directions, respectively.

11. The layout structure for the server chassis according to claim 10, wherein the motherboard module slides, in a vertical orientation, into the second section and comprises a third connector electrically connected with the second connector.

12. The layout structure for the server chassis according to claim 10, wherein the power supply is disposed at a top portion of the first section.

13. The layout structure for the server chassis according to claim 10, further comprising:
    at least one I/O module sliding into the first section of the chassis body via the second opening; and
    a board-to-board connector disposed on the motherboard module, the partition plate having at least one fourth opening communicating between the first section and the second section, the I/O module disposed at the first section being electrically connected with the motherboard module at the second section by the board-to-board connector passing through the fourth opening.

14. The layout structure for the server chassis according to claim 9, wherein the power backboard further comprises a fourth connector disposed on the first face of a pair of legs of opposite ends of the board.

15. The layout structure for the server chassis according to claim 14, further comprising an embedded management module sliding into the first section of the chassis body via the second opening so as to be connected to the fourth connector.

16. The layout structure for the server chassis according to claim 15, wherein the embedded management module slides, in a vertical orientation, into the first section and is positioned at opposite two sides of the first section adjacent the pair of side plates.

* * * * *